(12) United States Patent
Nowozin et al.

(10) Patent No.: US 10,742,990 B2
(45) Date of Patent: *Aug. 11, 2020

(54) DATA COMPRESSION SYSTEM

(71) Applicant: Microsoft Technology Licensing, LLC, Redmond, WA (US)

(72) Inventors: Sebastian Nowozin, Cambridge (GB); Ryota Tomioka, Cambridge (GB); Diane Bouchacourt, Oxford (GB)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/137,519

(22) Filed: Sep. 20, 2018

(65) Prior Publication Data

US 2019/0297328 A1 Sep. 26, 2019

Related U.S. Application Data

(63) Continuation of application No. 15/637,977, filed on Jun. 29, 2017, now Pat. No. 10,158,859.

(30) Foreign Application Priority Data

May 17, 2017 (GB) .................................. 1707912.0

(51) Int. Cl.
*H03M 7/38* (2006.01)
*H04N 19/149* (2014.01)
(Continued)

(52) U.S. Cl.
CPC ......... *H04N 19/149* (2014.11); *G10L 15/144* (2013.01); *H03M 7/30* (2013.01);
(Continued)

(58) Field of Classification Search
CPC . H03M 7/30; H03M 7/40; H04N 7/50; H04N 7/26563; H04N 9/045
(Continued)

(56) References Cited

U.S. PATENT DOCUMENTS 10,158,859 B2 * 12/2018 Nowozin ............. H04N 19/149

FOREIGN PATENT DOCUMENTS

EP 1324616 A1 7/2003

OTHER PUBLICATIONS

Bengio, et al., "Representation Learning: A Review and New Perspectives", In Proceedings of IEEE Transactions On Pattern Analysis And Machine Intelligence, vol. 35, No. 8, Aug. 1, 2013, pp. 1798-1828.
Blei, et al., "Variational Inference: A Review for Statisticians", In Journal Of The American Statistical Association, Feb. 27, 2017, 79 Pages.
Chang, Shin Fu., "Compressed-domain techniques for image/video indexing and manipulation", In Proceedings Of International Conference On Image Processing, Oct. 23, 1995, pp. 314-317.
(Continued)

*Primary Examiner* — Joseph J Lauture

(57) ABSTRACT

A data compression apparatus is described which has an encoder configured to receive an input data item and to compress the data item into an encoding comprising a plurality of numerical values. The numerical values are grouped at least according to whether they relate to content of the input data item or style of the input data item. The encoder has been trained using a plurality of groups of training data items grouped according to the content and where training data items within individual ones of the groups vary with respect to the style. The encoder has been trained using a training objective which takes into account the groups.

20 Claims, 8 Drawing Sheets

(51) Int. Cl.
  *G10L 15/14* (2006.01)
  *H03M 7/30* (2006.01)
  *H04N 19/12* (2014.01)
  *H04N 19/61* (2014.01)
  *H04N 19/94* (2014.01)
  *H04N 19/97* (2014.01)
  *G06F 16/28* (2019.01)
  *H03M 7/40* (2006.01)
  *H04N 9/04* (2006.01)

(52) U.S. Cl.
  CPC .......... *H03M 7/3079* (2013.01); *H04N 19/12* (2014.11); *H04N 19/61* (2014.11); *H04N 19/94* (2014.11); *H04N 19/97* (2014.11); *G06F 16/285* (2019.01); *H03M 7/40* (2013.01); *H04N 9/045* (2013.01)

(58) Field of Classification Search
  USPC .......... 341/51, 50, 67; 375/240.01; 382/232, 382/240; 348/272
  See application file for complete search history.

(56) References Cited

OTHER PUBLICATIONS

Khan, et al., "Kullback-Leibler Proximal Variational Inference", In Proceedings of 28th International Conference on Neural Information Processing Systems, Dec. 7, 2015, pp. 1-9.

"International Search Report and Written Opinion Issued in PCT Application No. PCT/US2018/028742", dated Sep. 24, 2018, 20 Pages.

Sikora, Thomas, "The MPEG-4 Video Standard Verification Model", In Journal of IEEE Transactions On Circuits And Systems For Video Technology, vol. 7, No. 1, Feb. 1, 1997, pp. 19-31.

Tekalp A M, et al., "Face and 2-D mesh animation in MPEG-4", In Journal of Signal Processing: Image Communication, vol. 15, Issues 4-5, Jan. 1, 2000, pp. 387-421.

Torres, et al., "A proposal for high compression of faces in video sequences using adaptive eigenspaces", In Proceedings of IEEE International Conference On Image Processing, Sep. 22, 2002, 7 Pages.

* cited by examiner

DATA COMPRESSION SYSTEM

CROSS-REFERENCE TO RELATED APPLICATIONS

This application is a continuation of and claims priority to U.S. Non-Provisional application Ser. No. 15/637,977, filed on Jun. 29, 2017, which claims priority to GB application serial number 1707912.0, filed May 17, 2017, the entireties of which are hereby incorporated by reference herein.

BACKGROUND

Compressing images, documents and other structured data is an ongoing challenge in order to save memory and/or reduce bandwidth requirements for communicating data. Digital images, including digital videos in video conferencing systems, medical image volumes and streams of depth frames captured by depth cameras of augmented reality computing devices contain huge amounts of data and it is a challenge to store, transfer and decompress/decode this in practical manners. The same situation is found for other types of structured data such as speech signals, documents, emails, text messages, sensor data collected by mobile devices, and others.

Conventional image and document compression systems are available which operate by identifying redundant information in videos, images or documents and collapsing that redundancy into an encoded form such that the encoded, compressed images or documents may be decompressed when required without significant loss as compared with the original. However, these conventional compression systems produce compressed images or documents which, once in their compressed form are not suitable for tasks other than storage and transmission. Such conventional techniques compress the images or documents to a certain extent and there is an ongoing desire to improve the amount of compression which can be achieved, whilst still enabling decompression without significant loss from the original.

The embodiments described below are not limited to implementations which solve any or all of the disadvantages of known data compression systems.

SUMMARY

The following presents a simplified summary of the disclosure in order to provide a basic understanding to the reader. This summary is not intended to identify key features or essential features of the claimed subject matter nor is it intended to be used to limit the scope of the claimed subject matter. Its sole purpose is to present a selection of concepts disclosed herein in a simplified form as a prelude to the more detailed description that is presented later.

A data compression apparatus is described which has an encoder configured to receive an input data item and to compress the data item into an encoding comprising a plurality of numerical values. The numerical values are grouped at least according to whether they relate to content of the input data item or style of the input data item. The encoder has been trained using a plurality of groups of training data items grouped according to the content and where training data items within individual ones of the groups vary with respect to the style. The encoder has been trained using a training objective which takes into account the groups.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

Figure 1:
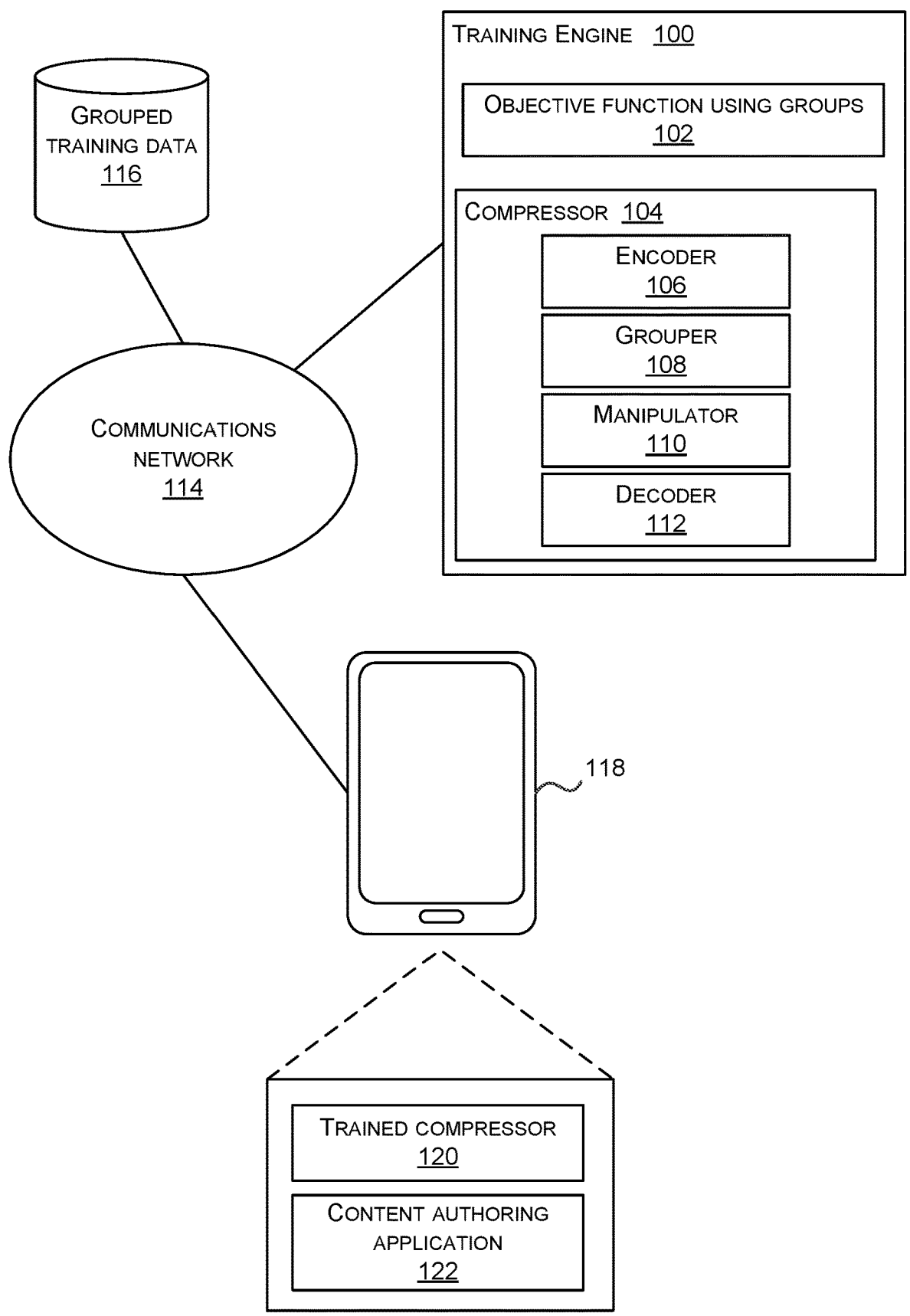
FIG. 1 is a schematic diagram of a training engine 100 in communication with one or more computing devices via a communications network.

The detailed description provided below in connection with the appended drawings is intended as a description of the present examples and is not intended to represent the only forms in which the present example are constructed or utilized. The description sets forth the functions of the example and the sequence of operations for constructing and operating the example. However, the same or equivalent functions and sequences may be accomplished by different examples.

The technology described herein is concerned with representation learning which is a field of engineering in which large volumes of videos, images, documents or other structured digital data is to be compressed, from a huge multi-dimensional input space, into a representation which has vastly reduced numbers of dimensions. This is to be achieved in a manner which is substantially reversible so that the compressed videos, images, speech signals, documents or other data may be decoded from the compressed representation to yield an output which is substantially similar to the original. In addition, representation learning seeks to find ways in which computing devices can learn to separate out parts of the representations which are semantically meaningful so the representations can be more easily exploited. That is, the representations are to be used for tasks in addition to pure compression and decompression; the compressed representations are to be manipulated in a ready manner so that upon decompression new videos, images or other structured data is obtained. The representation is to be learnt in such a manner that the manipulation is controllable to produce new videos, images or other structured data with factors (also known as properties or characteristics) which have been manipulated in an expected manner.

In an example described herein, an image of a person's head and shoulders is compressed, manipulated to become similar to an image of another person's head and shoulders (but not similar to detail in the image of the other person such as hair style, or facial orientation), and then decompressed. In another example, a speech signal of a first person is compressed, manipulated to become similar to a speech signal of another person (but not similar to background noise in the speech signal) and then decompressed. In another example, a person highlights a sentence which he or she is writing using a computing device, and requests suggestions from a computer-implemented sentence thesaurus tool. The sentence is compressed, manipulated to become similar to a writing style of each of a plurality of famous authors, and then decompressed to produce a plurality of sentences which are offered to the writer for input to the computing device.

Representation learning is achieved using machine learning technology in various examples described herein, where the machine learning technology uses an encoder and a decoder which are trained together.

It is a huge challenge to train the encoder and decoder so that it achieves good representation learning since it is difficult to obtain suitable training data in sufficient amounts. In various examples described herein, ways of training the encoder and decoder are described which enable large amounts of readily available grouped data to be used for training. In addition, the ways of training enable representations to be encoded which are not only highly compressed but are also useful for manipulation tasks because they are separated out into useful parts. The ways of training the encoder and decoder use a training objective function which is specially designed to take into account groups within the training data. As a result, after training, a highly accurate compressor is obtained which may be deployed on electronic devices such as smart phones, personal computers, smart watches and others. The compressor is accurate in that it is able to reverse the encoding to produce an output significantly the same as the original. The compressor is accurate in the sense that it is able to produce a compressed representation which is useful for manipulation tasks.

After training, the compressor is able to compute a compressed representation for a new input example, such as an image, video, speech signal or document, even if the input example has not previously been available to the compressor. The input example in this case does not need to have associated group data. In situations where grouped input examples are available, the group information is exploited at test time to reduce uncertainty associated with the compressed representation. An example where grouped data is available is where the compressor is used to identify a person depicted in frames of a video conference signal, as the frames of the video depicting the person are within the same group. At test time, the compressor is able to use the plurality of frames depicting the person to reduce uncertainty associated with the compressed representation, and more quickly identify which person is depicted in the video. This is one example only and is not intended to limit the scope of the technology.

FIG. 1 is a schematic diagram of a training engine 100 which is computer implemented using one or more compute servers, or computing nodes such as in a data center or other computing network. The compute nodes may comprise graphics processing units, fast on-chip memory, or other hardware to enable processing of vast amounts of data in practical time scales. The training engine 100 comprises one or more stored objective functions 102 which are designed to exploit information about groups of training data instances, and which are used for training a compressor 104. An objective function is a description of how to update parameters of the compressor during a training phase, and in the light of training examples, as explained in more detail below.

The compressor 104 comprises an encoder 106, a grouper 108, a manipulator 110 and a decoder 112. The encoder and the decoder 112 are neural networks in some examples, although this is not essential as in some cases the encoder and decoder are implemented using look up table technology formed using stochastic variational inference (SVI). The decoder is a generative model which describes generation of observations (images, videos documents, or other structured data items) from a plurality of latent variables where a latent variable is an unobserved variable. During training it is desired to infer the values of the latent variables that generated the observations, which is the same as learning a posterior probability distribution over the latent variables given one or multiple observations. Often, calculating a posterior probability distribution over the latent variables is intractable and so the encoder is trained to compute a variational approximation of the posterior distribution over the latent variables. The encoder has parameters and the decoder has parameters. During training values of the parameters of the encoder and decoder are learnt as described in more detail below.

In FIG. 1 the grouper is shown as a separate entity but this is not essential as it is integral with the encoder 106 in some cases. The encoder, once trained, takes as input a high multi-dimensional representation of a structured data instance such as a video, image, medical volume, speech signal, document, email, and computes a compressed representation of the data instance. The compressed representation comprises a plurality of numerical values, such as in the form of a vector or other format, where the values represent parameters of a variational approximation of a posterior probability distribution over latent variables of the data. In the present technology, a latent variable represents knowledge about a property which is learnt about during a training phase. In the case of documents an example of a property is a writing style such as a scientific report writing style, or an informal letter writing style. In the case of images an example of a property is facial identity of a person. In the case of speech signals an example of a property is a regional dialect.

The grouper 108 acts to take into account groups available in training data and at test time, the grouper 108 is optional. In various examples the grouper reconstructs the estimate of the posterior probability distributions over the latent variables using the group information by one or more of: applying a bias term, computing a product of density functions of the estimates of the posterior for each instance in a group, computing a mixture of density functions of the estimates of the posterior for each instance in a group. The manipulator 110 is optional and operates to manipulate the compressed representation output by the encoder 106 and grouper 108. The decoder 112 reverses the encoding operation to compute an output such as a video, image, document, speech signal, or other structured data item.

The training engine has access to grouped training data 116 via a communications network 114 or where the training data 116 is stored at the training engine 100 itself. The grouped training data comprises examples appropriate for the task that the compressor 104 computes. Where the task is to compress speech signals the grouped training data may comprise speech signals from many different individuals and where the speech signals are grouped by geographical region of the individuals. Where the task is to compress documents the grouped training data may comprise a plurality of documents grouped by author. It is important to note that the training data is not labeled in any other way, apart from to indicate the groups. The similar characteristics of the structured data items which led to the groups is not known in advance. As a result the examples described herein have access to large amounts of readily available training data since document libraries, image libraries, video collections and others are already available from many sources where the data is grouped. This significantly reduces the expense of obtaining training data as compared with fully labeled training data which is labeled by human experts or automated systems. In addition, because the amount and variety of grouped training data available is large the quality of the resulting trained compressor is good, and the ability of the trained compressor to generalize to examples which it has not previously encountered is high.

Once the compressor 104 has been trained at the training engine 100 all or part of it is deployed at individual electronic devices such as a smart phone 118, or other electronic device. A non-exhaustive list of examples of electronic devices where the compressor 104, or part of the compressor may be deployed is: augmented-reality head worn computing device, personal computer, smart watch, laptop computer, tablet computer, game console. Smart phone 118 of FIG. 1 shows a trained compressor 120 which has been installed at the smart phone after the compressor has been trained using training engine 100. The trained compressor 120 of the smart phone operates in conjunction with a content authoring application 122 installed at the smart phone 118 so that an end user is able to author content, compress content using the trained compressor 120, decode compressed content and manipulate compressed content.

In some examples, the training engine 100 trains the compressor 104 and retains all or part of the trained compressor at one or more computing entities remote of the smart phone 114. In this way a cloud service is enabled whereby the all or part of the compressor 104 functionality is accessible remotely via the communications network 114. In an example, at test time, images, videos, documents or other structured data items suitable for the compressor 104 are sent from a client device such as smart phone 118 or other electronic device, to the compressor 104 via communications network 114. The compressor 104 computes the compressed representation of the structured data item and makes that available to the smart phone 118 or other client device. The smart phone 118 or other client device receives user input requesting manipulation of the compressed representation and the manipulator computes the requested manipulation. The manipulator is at the client device, or at the remote entity, or shared between the client device and the remote entity. The results of the manipulation may then be sent between entities and may be decoded using decoder 112 at the remote entity or using a decoder at the client device.

Alternatively, or in addition, the functionality of the compressor 104 described herein is performed, at least in part, by one or more hardware logic components. For example, and without limitation, illustrative types of hardware logic components that are optionally used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), Graphics Processing Units (GPUs).

In various examples described herein, the probability distributions of the latent variables computed by the encoder are divided into at least two factors of variations which are referred to herein as style and content. The content is the factor by which the members of a group are grouped; that is, the content varies between groups and is the same within a group. The style differs within a group. However, it is also possible to have more than two types of groups. An example where there are more than two types of groups is where sentences are grouped by author (first type of group) and also grouped by length (second type of group). The compressor is trained to compute a compressed representation comprising a latent variable relating to author, a latent variable relating to length and a latent variable relating to intra-group variation.

Figure 2:
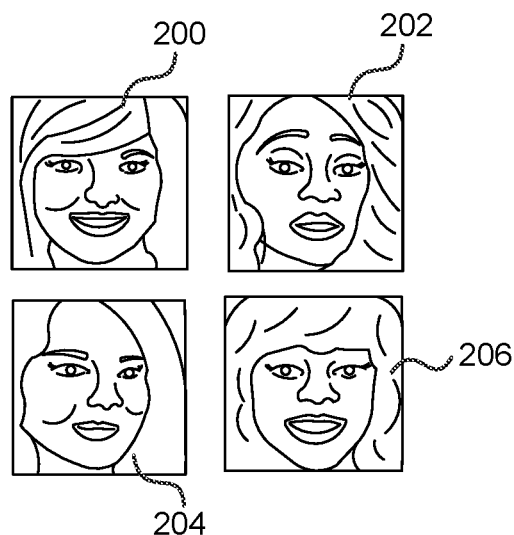
FIG. 2 is a schematic diagram of example images input to a compressor and of example images output by a decoder after manipulation of a compressed representation of the input images.

In some embodiments the compressor operates on images. FIG. 2 is a schematic diagram of example images 200, 202 input to the compressor 104. Image 200 is a digital photograph of a woman's face and hair, where the woman has shoulder length straight hair and a fringe with a side parting. The woman is smiling and facing the camera directly. Image 202 is a digital photograph of a different woman's face and hair where the woman is at an angle to the camera and has shoulder length wavy hair with no fringe. The compressor has already been trained using many images of people's faces where the images are grouped by person. Each group comprises a plurality of images of the same person's face with variations, such as where the images were captured depicting the person's face in different poses, with different hair styles, and with or without sunglasses. During training the compressor has learnt to compute latent variables which express the groups i.e. the identity of the people, and the style where style is the other variations. After training, image 200 is input to the compressor which computes a compressed representation of the image 200. The compressed representation comprises parameters of an estimate of a posterior probability distribution representing belief about the identity of the person depicted in the image. The image 202 is also input to the compressor to obtain another compressed representation. The compressed representation for the first image 200 is manipulated to make the latent variables expressing the identity of the woman become like the latent variables expressing the identity of the second woman (of image 202) from the second compressed representation. The manipulated latent variables are then decoded to produce image 206. Image 206 depicts a woman with a fringe and shoulder length hair, where the woman's face (width of nose, fullness of lips) is similar to that of image 202 and the style (fringe, facing camera pose, smile) is similar to that of the original image 200. In another case, the compressed representation of image 202 is manipulated to make the latent variables expressing the identity of the woman become like the latent variables expressing the identity of the first woman (of image 200). The manipulated latent variables are then decoded to produce image 204. Image 204 depicts a woman with no fringe, looking side on to the camera, and with facial features similar to the woman depicted in image 200.

The example given with reference to FIG. 2 is one example of how the present technology is used to compress, optionally manipulate, and decode images, and this example is not intended to limit the scope of the technology. Many other examples are possible such as where a multi-dimensional space of the latent variables is represented in a graphical manner such that a user is able to visually control the manipulation of the latent variables before the decoding operation is done.

In another example, the compressor is trained with a plurality of speech signals which are grouped by regional accent. The compressor receives a new speech signal at test time and computes the compressed representation. Manipulation is then used to make a compressed speech signal of speech in an original regional accent have the same spoken words but in a different regional accent when decoded by the decoder. In an example, the latent variables of the compressed representation which relate to regional accent are replaced by values for the desired different regional accent.

In another example, the compressor is trained with a plurality of text documents which are grouped by author. The compressor receives a new text document at test time and computes a compressed representation expressing belief about the author of the document and about style (intra-group variation). Manipulation is then used to make the new text document take on the writing style of a different author after decoding.

As mentioned above the compressor 104 is trained by training engine 100 using grouped training data 116. The training engine 100 uses an objective function 102 that takes into account the groups of the training data 116. The objective function 102 is designed so that when it is used by the training engine 100 to update parameters of the encoder 106 and decoder 112 during training, the values of the latent variables representing the group factor, for instances in the same group become similar to one another.

As part of the training process, the grouper reconstructs or refines the estimate of the posterior distribution over the latent variables, using the group information.

In some examples the grouper computes and applies a bias term to enable it to take into account the groups of the training data 116. For training instances in the same group, the bias term acts to penalize differences in the latent variables expressing belief about the content (i.e. the group characteristics), and/or it acts to promote similarity in the latent variables expressing belief about the content.

In some examples the grouper computes, for each group, a product of normal probability density functions. In this case, the encoder computes as output parameters of normal probability density functions which describe variation in the input instances. The normal probability distributions for each instance in the same group are multiplied together as part of the objective function. This enables the encoder to learn to compute a similar latent representation for instances in the same group. Since a product of normal distributions is computationally efficient to compute the accuracy and efficiency of the training engine 100 is enhanced.

In some examples the grouper computes, for each group, a mixture of normal probability distributions. In this case, the encoder computes as output parameters of normal probability distributions which describe variation in the input instances. The normal probability distributions for each instance in the same group are used to form a mixture as part of the objective function. This enables the encoder to learn to compute a similar latent representation for instances in the same group.

The grouping operation, such as the product of normal density functions, the mixture of normal density functions and the bias term are computed by grouper 108 of the compressor 104. The grouper 108 is either a separate layer between the encoder 106 and the decoder 112 or is, at least in part, integral with the encoder 106.

Figure 3A:
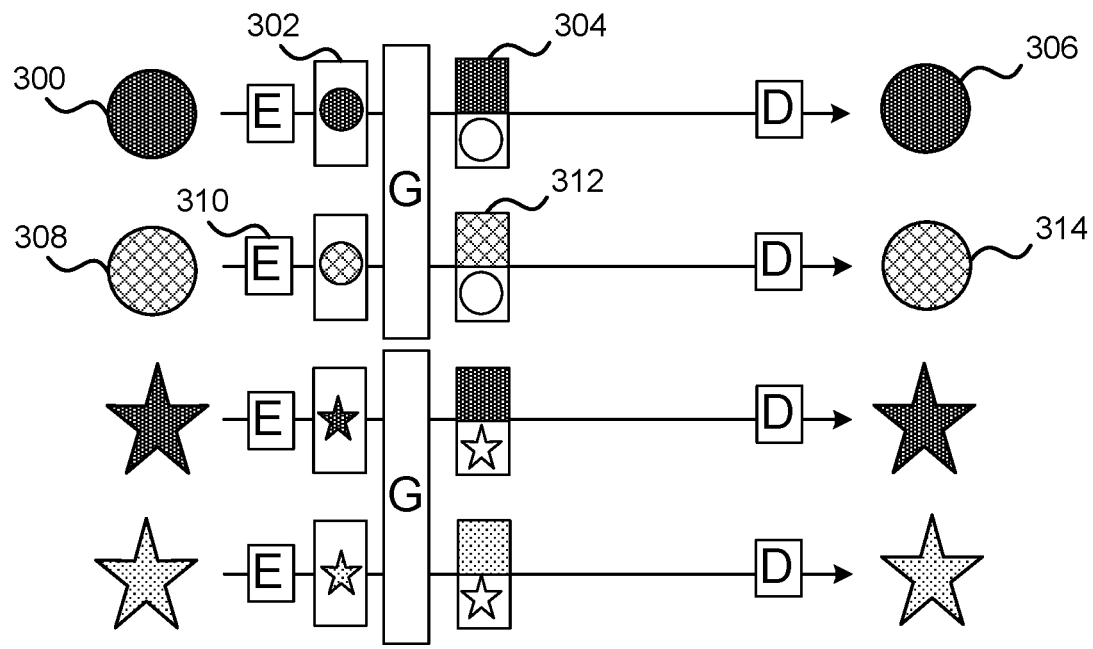
FIG. 3A is a schematic diagram of an encoder and decoder of a compressor at the start of a training phase.

More detail about how the training engine 100 trains the compressor 104 is now given. FIG. 3A is a schematic diagram of an encoder 106 and decoder 112 of the compressor 104 at the start of a training phase. In FIGS. 3A, 3B, 5A, 5B and 6 the encoder is represented by the letter E in a rectangle, the grouper is represented by the letter G in a rectangle and the decoder is represented by the letter D in a rectangle. In this example the training instances comprise images of circles or stars, of possible fills: dotted fill, check fill and dark fill. Suppose that the training data comprises images grouped by shape, i.e. circled or starred.

Figure 3B:
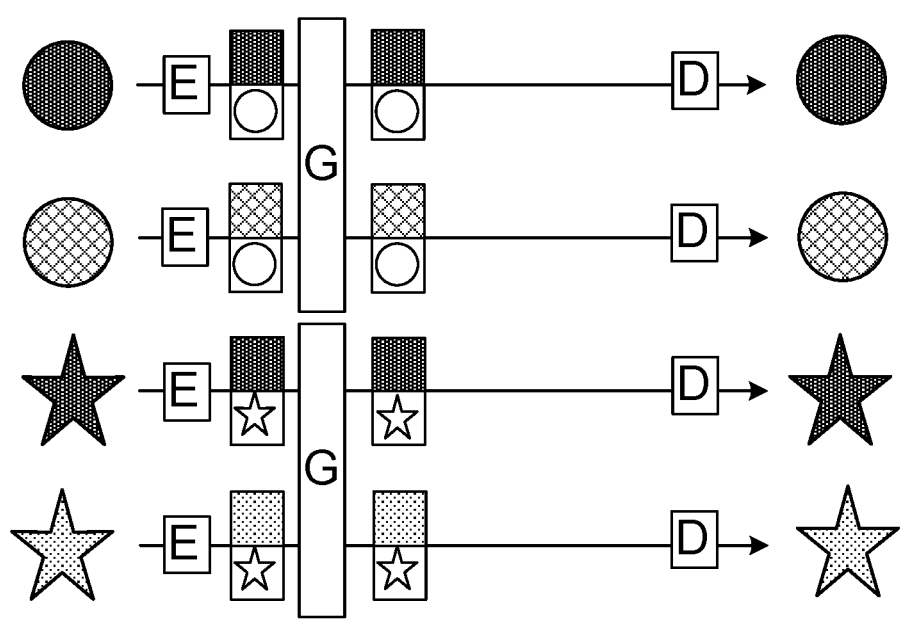
FIG. 3B is a schematic diagram of the encoder and decoder of FIG. 3B after training.

In the examples of FIGS. 3A and 3B there are four horizontal arrows each depicting flow of an individual training instance through the encoder, grouper and decoder. In the case of FIG. 3A the uppermost horizontal arrow shows a training instance which is an image of a dark fill circle 300 being processed by the encoder to produce an encoding 302 comprising a plurality of numerical values such as in a vector or other form. The encoding 302 is input to the grouper which computes grouped encoding 304 and grouped encoding 304 is decoded by the decoder to produce output image 306 which is substantially the same as the input image 302. For the second horizontal arrow, input image 308 is encoded to give encoding 310 which is processed to give grouped encoding 312 and decoded to give output image 314.

At the start of the training process as indicated in FIG. 3A the encoder has not yet learnt from the group information and therefore the encoding 302 is not separated out into values representing factors related to the groups (circle or star) and other factors such as color. The next horizontal arrow in FIG. 3A shows a training instance which is an image of a check fill circle 308 being processed by the encoder to produce an encoding 310. Again the encoding 310 is not separated out into values representing factors related to the groups (circle or star). The grouper knows from the training data that training images 300 and 308 are in the same group. The grouper separates the encoding 302 of the dark fill circle image 300 into two parts, one representing the style and one representing the content (circle or star in this case). For illustrative purposes, the upper part of the encoding 304 output by the grouper represents the style (color) and the lower part the content (circle or star). The grouper makes the same separation for the encoding 310 of the check fill circle to give separated encoding 312.

Due to the training objective function taking into account the groups, the encoder comes to learn how to compute the encoding so that it is automatically separated into the style and content parts, so that the content parts are similar for training images of the same group. For example, the encoder comprises a neural network where the last layer of the neural network is separated into two parts. One part outputs the parameters of the posterior probability distributions describing knowledge about the content latent variables and the other part outputs the parameters describing knowledge about the style latent variables. Then at the end of the training process, as illustrated in FIG. 3B the encoding 302 is already separated into the content and style parts and the same is the case for each of the input instances of the four arrows. In this way the encoder learns a semantically meaningful disentanglement of the encoding 302. Note that the grouper does not need to know that the training images are grouped by shape as long as it knows which training images are in which groups. The grouper does not need to know what shape and color represent. The only supervision is the organization of the training images into the groups.

Figure 4:
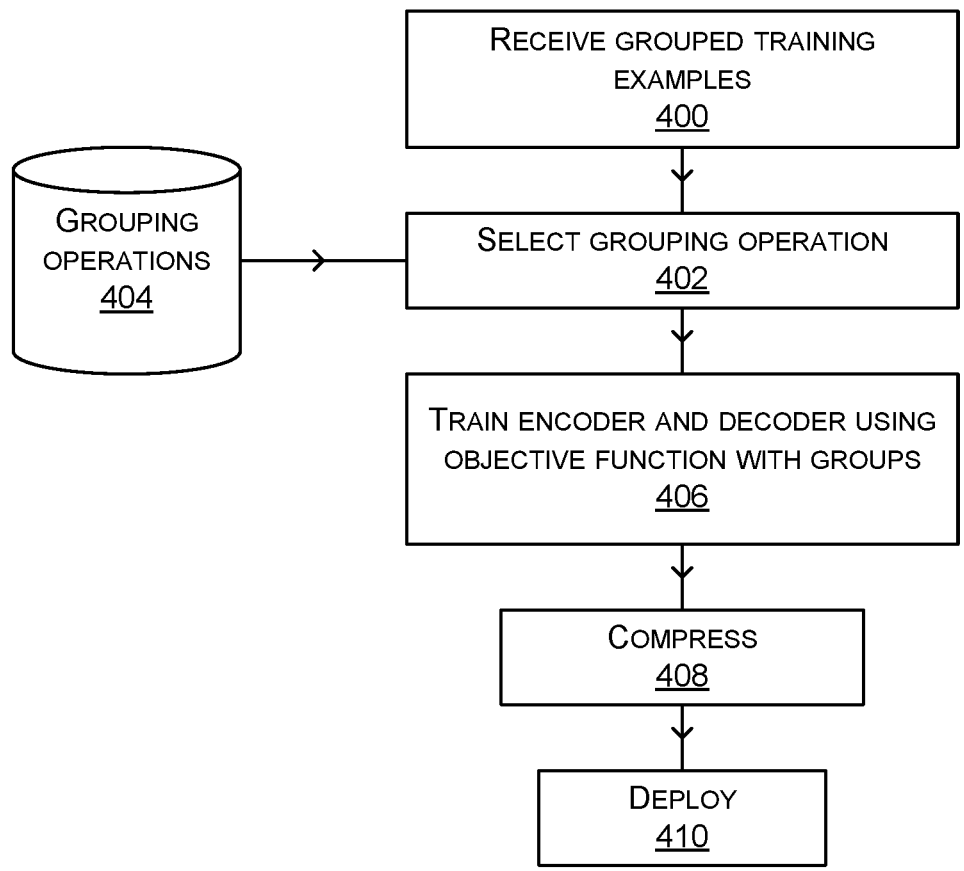
FIG. 4 is a schematic diagram of a method of training a compressor such as that of FIG. 1.

FIG. 4 is a flow diagram of a method of operation at the training engine 100. The training engine receives a plurality of grouped training examples, such images, documents, speech signals or other structured data depending on the application domain. The training engine selects 402 a grouping operation 404 to be used as part of the training objective function 102. For example, the grouping operation is one or more of: a bias term in the objective function, a product of normal probability density functions from the encoder for training instances of the same group, a mixture of normal probability density functions from the encoder for training instances of the same group.

The training engine 100 trains the encoder and the decoder using the objective function which incorporates group information. During training there is an operation by the grouper which computes the reconstruction or revision of the estimate of the posterior distributions over the latent variables using the group information. Once trained the encoder and decoder are optionally compressed 408 and deployed 410 at one or more computing devices such as smart phone 118 of FIG. 1.

An example of a training objective which may be used is:

$$\frac{1}{|G|}\sum_{G\in G} ELBO(G; \theta, \phi_s, \phi_c)$$

which is expressed in words as the average group evidence lower bound. The optimization seeks to find the values of the parameters of the encoder, including encoder content parameters $\phi_c$ and encoder style parameters $\phi_s$; and the parameters of the decoder $\theta$, which maximize the average group G evidence lower bound (ELBO). A group evidence lower bound is defined mathematically as:

$$ELBO(G; \theta, \phi_s, \phi_c) = \sum_{i\in G} E_{q(C_G|X_G;\phi_C)}[E_{q(S_i|X_i;\phi_s)}[\log p(X_i \mid C_G, S_i; \theta)]] - \sum_{i\in G} KL(q(S_i \mid X_i; \phi_s) \| p(S_i)) - KL(q(C_G \mid X_G; \phi_c) \| p(C_G))$$

Which is expressed in words as the evidence lower bound of a group is equal to the sum over instances in the group, of the expectation from the posterior distribution over the content latent variables, of the expectation from the posterior distribution over the style latent variable, of the logarithm of the probability of a sample instance from the group given the content latent variable of the group and the style latent variable of the instance and the parameters of the decoder, minus a regularizer term for the style and minus a regularizer term for the content. The regularizer terms are Kullback-Leibler (KL) divergences in the above equation although other regularizer terms may be used.

The group evidence lower bound is a lower bound on the marginal likelihood of the observations within one group arising from the decoder model. Maximizing this lower bound therefore improves the quality of the decoder model by making the observed data more plausible.

In an example, the encoder is configured to compute the estimate of the posterior distribution in the form of normal probability density functions. This gives a benefit that the regulariser terms may be computed in a closed form, where the regularizer terms are Kullback-Leibler divergences and significant computational efficiencies are gained.

In an example an estimate of the above training objective is computed and minimized by performing gradient ascent on the parameters. This results in an example training algorithm as set out below which uses minibatching of grouped observations.

A training process is repeated for each of training epochs t=1 to T. A minibatch of groups is sampled from the complete set of groups (where a minibatch comprises some but not all of the available groups), and for each group in the minibatch, the training engine 100 encodes each training instance in the group using the encoder. In some examples, where the number of training instances in each group is huge, samples of training instances are taken and an allowance is made for any consequential bias in the process.

Using the grouper, the encodings of the training instances which relate to content are made similar to one another by computing the grouping operation which is any of the grouping operations described above, or another type of grouping operation.

For each group of the minibatch, and for each training instance of the group, a sample from the probability distributions computed by the encoder which relate to the group factors is taken, and a sample of from the probability distributions computed by the encoder which relate to the style factors is taken. The sampled parameter values are input to the decoder to compute an output instance (such as an output image, output speech signal or other output instance depending on the application domain).

The performance of the encoder and decoder in the light of the input and output instances is assessed by computing the objective function mentioned above. The gradient of the objective function is computed and using gradient descent, or an equivalent process, the parameters of the encoder and decoder are updated. The process repeats for each of the training epochs.

Figure 5A:
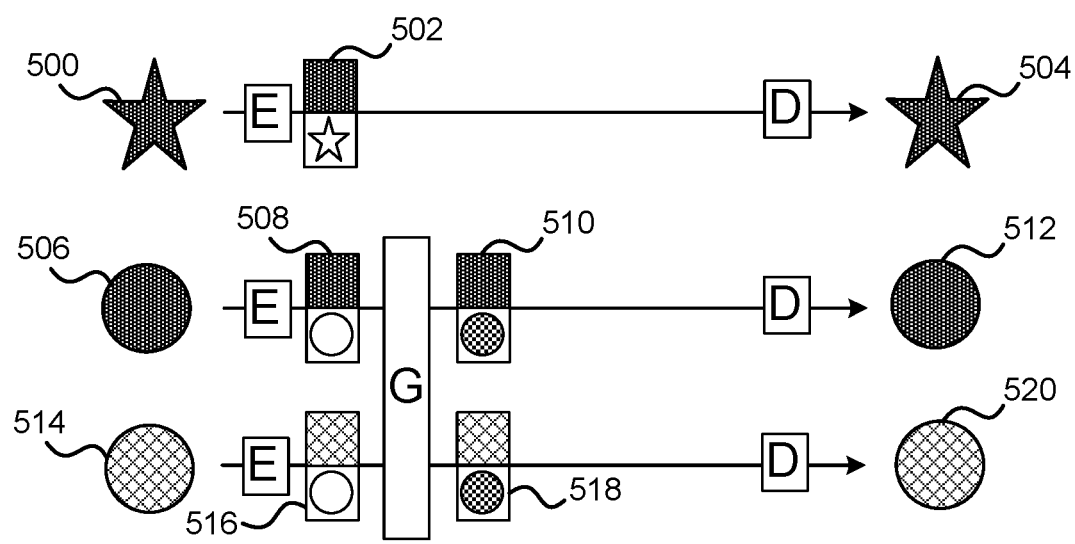
FIG. 5A is a schematic diagram of use of the encoder and decoder of FIG. 3B at test time.

FIG. 5A is a schematic diagram of use of the encoder and decoder of FIG. 3B at test time in the case of three input examples which are an image of a dark fill star 500, an image of a dark fill circle 506 and an image of a check fill circle 514. The encoder processes the image of the dark fill star 500 and computes encoding 502 which comprises parameters of probability distributions over latent variables of the compressor. The encoding 502 is computed so that the parameters of the probability distributions over the content latent variables are separated from the parameters of the probability distributions over the style latent variables. This is achieved without the need for the grouping operation by the grouper since during the training phase the parameters of the encoder have been learnt and enable the separation to be computed. Thus the trained compressor is operable with input instances which have no group data associated with them. The decoder decodes the encoding 502 to produce an output image 502 which is substantially the same as the input image 500.

Another test time example is shown in the bottom two horizontal lines of FIG. 5A. Here group information is available and is used by the grouper. An input image comprising a dark fill circle is input to the encoder. Since the encoder has been trained as described with reference to FIGS. 3A and 3B, the encoder computes an encoding 508 which is already separated into content and style latent variable information. For another input image comprising a check fill circle, the encoder computes an encoding 516 which is separated into content and style latent variable information. The grouper knows that the input images of the dark fill circle 506 and the check fill circle are grouped as it obtains this group information from user input, from image processing of the input images, or by inspecting the encodings 508, 516. The grouper combines evidence from the encodings 508, 516 of the grouped instances to produce refined encodings 510, 518. In this way the grouper is able to increase the certainty of the content latent variable values. The increased certainty is indicated in FIG. 5A by the filled circles in the encodings 510, 518 output by the grouper. The refined encodings 510, 518 are processed by the decoder to generate output images 512, 520 respectively.

Figure 5B:
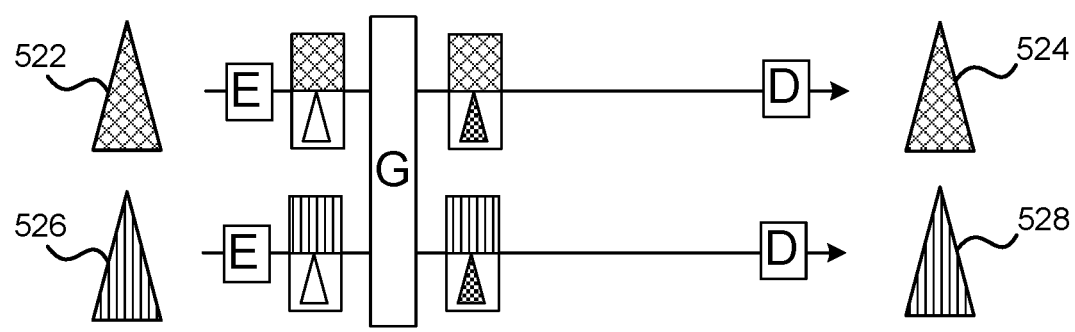
FIG. 5B is a schematic diagram of use of the encoder and decoder of FIG. 3B at test time in the case of new instances of shape and fill.

FIG. 5B is a schematic diagram of use of the encoder and decoder of FIG. 3B at test time in the case of new instances of shape and color. The examples of FIG. 5 B illustrate the generalization ability of the trained compressor, which is its ability to compute meaningful, disentangled representations of input instances which have not been used in training. In the top line of FIG. 5B an input instance comprising an image of a check fill triangle 522 is input to the encoder. The encoder computes an encoding which is already separated (disentangled) into values for latent variables representing the content and the style. In this case, the shape is the content and the color is the style. In the bottom line of FIG. 5B an input instance comprising an image of a vertical striped triangle 526 is input to the encoder. The encoder computes an encoding which is already separated (disentangled) into values for latent variables representing the content and the style.

The grouper detects that the input instances 522, 526 are grouped by inspecting the encodings, or by using other sources of data. The grouper combines information from the encodings of the check fill triangle 522 and the vertical striped triangle 526 to make the values describing knowledge of the content latent variables more certain. The grouper outputs revised encodings. The decoder decodes the encodings output by the grouper to produce output images 524 of a check fill triangle and a vertical striped triangle 528.

Figure 6:
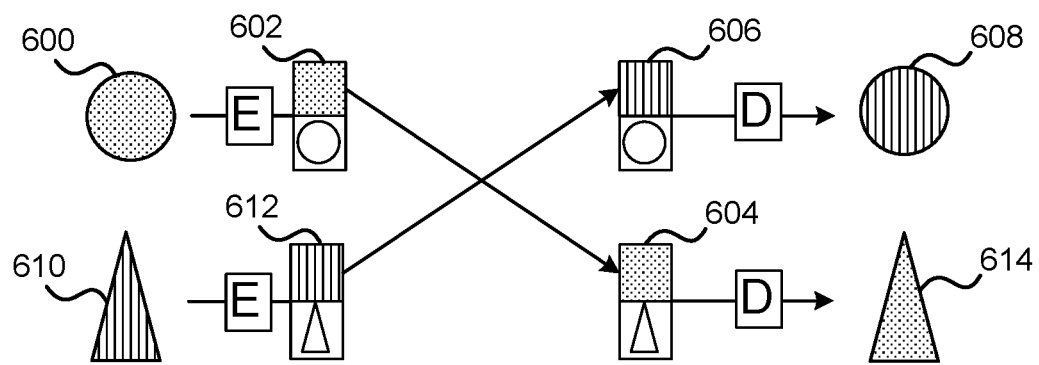
FIG. 6 is a schematic diagram of use of the encoder and decoder of FIG. 3B and of use of the manipulator of FIG. 1.

FIG. 6 is a schematic diagram of use of the trained encoder and decoder of FIG. 3B and of use of the manipulator of FIG. 1. A first input instance which is an image of a dotted fill circle 600 is input to the encoder which computes first encoding 602. First encoding 602 is separated into values describing knowledge of the content latent variables and values describing knowledge of the style latent variables. A second input instance which is an image of a vertical striped triangle 610 is input to the encoder which computes second encoding 612. Second encoding 612 is separated into values describing knowledge of the content latent variables and values describing knowledge of the style latent variables.

The manipulator replaces the values related to style in the second encoding with the values relating to style in the first encoding to produce manipulated encoding 604. The manipulator replaces the values related to style in the first encoding with the values relating to style in the second encoding to produce manipulated encoding 606. The decoder decodes the manipulated encodings 604, 606 to give an output image of a vertical striped circle 608 and an output image of a dotted fill triangle 614. In this way new output instances are created.

Figure 7:
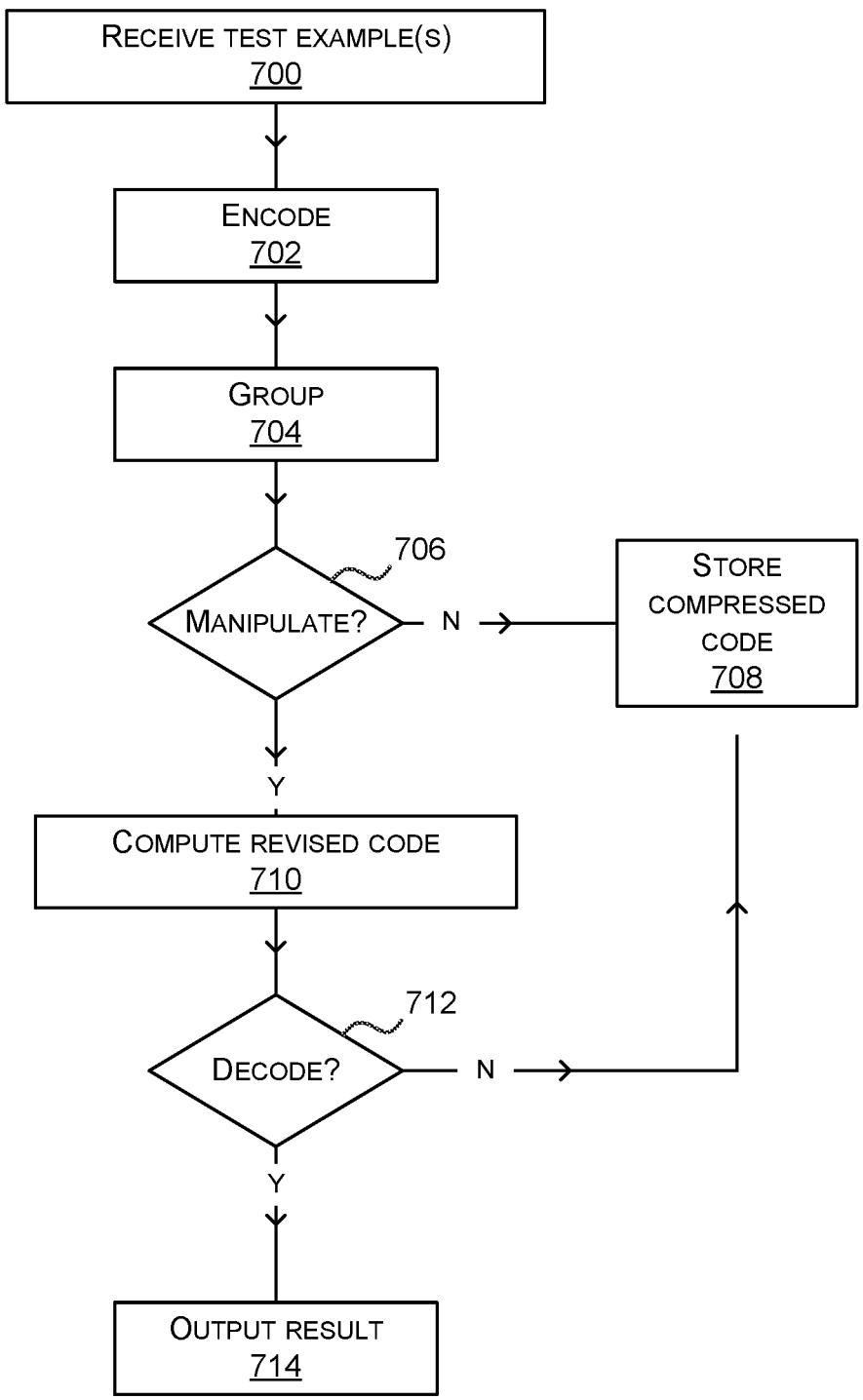
FIG. 7 is a flow diagram of a method of operation of the encoder and decoder of FIG. 3B at test time.

FIG. 7 is a flow diagram of a method of operation of a trained compressor, such as the encoder and decoder of FIG. 3B at test time. Note that at test time, the grouper is optional and is omitted in some cases where input instances are not grouped. One or more test examples are received 700 at the trained compressor. For example, where the compressor has been trained using videos the test examples are videos which were not in the training data. For example, where the compressor has been trained using images the test examples are images which were not in the training data.

The trained encoder of the compressor computes, for individual ones of the test examples, an encoding comprising values indicating knowledge about the content latent variables and the style latent variables. The compressor checks whether a plurality of the test examples are grouped by inspecting the encodings and/or by using other sources of data about the test examples. If a plurality of the test examples are grouped the encodings computed for these test examples are revised by the grouper to give more certainty about the values of the latent variables. Where individual test examples are not grouped the grouper takes no action.

The compressor checks whether manipulation is to be done at check 706. In some cases the compressor is configured to carry out manipulation when user input has indicated this is desired. In some cases the compressor carries out manipulation when specified criteria are met or according to rules. If no manipulation is to be done the compressor stores 708 the compressed code (i.e. the encoding) and makes this available to other entities such as downstream applications or other computing devices.

If manipulation is to be done the manipulator computes revised encodings 710. A non-exhaustive list of examples of types of manipulation is: swap values of latent variables between two or more encodings, transfer values of latent variables from one encoding to another, interpolate values of latent variables from one encoding to another, scale latent variables of an encoding, transform values of latent variables of an encoding according to user input made in relation to a graphical representation of a multi-dimensional space of the latent variables. In an example, a low dimensional representation of the style space is computed by the manipulator and presented to a user at a graphical user interface. The user is able to make input at the graphical representation of the style space to specify the manipulation in a continuous way. The user is able to navigate in the representation which has been calibrated with data from labeled observations in some cases.

The manipulator computes revised codes 710 which are revised versions of one or more encodings from the encoder. The compressor checks 712 whether to decode the revised encodings according to user input, criteria or rules. The compressor outputs a stored compressed code 708 which is the revised encoding(s) in the case that no decoding is done. Where the decoder decodes the revised encoding(s) new instances such as images, videos, documents or other instances are output as results 714.

More detail about the encoder and the decoder is now given in the case that these components are implemented using neural network technology (which is not essential as mentioned above).

In an example where the compressor is used for image processing, the encoder and the decoder are neural networks with a linear architecture comprising rectified linear units activations functions. In this example the neural networks are deep in that they comprise a plurality of layers of interconnected nodes. The output layer of the encoder neural network is separated into two parts. One part outputs the parameters of the estimate of the posterior distribution of the content latent variables and the other part outputs the parameters of the estimate of the posterior distribution of the style latent variables. This type of neural network architecture may also be used where the compressor operates on other types of data.

Other types of neural network architecture may be used, such as non-linear architectures with recurrence and others.

The choice of neural network architecture to be used depends on the application domain.

Figure 8:
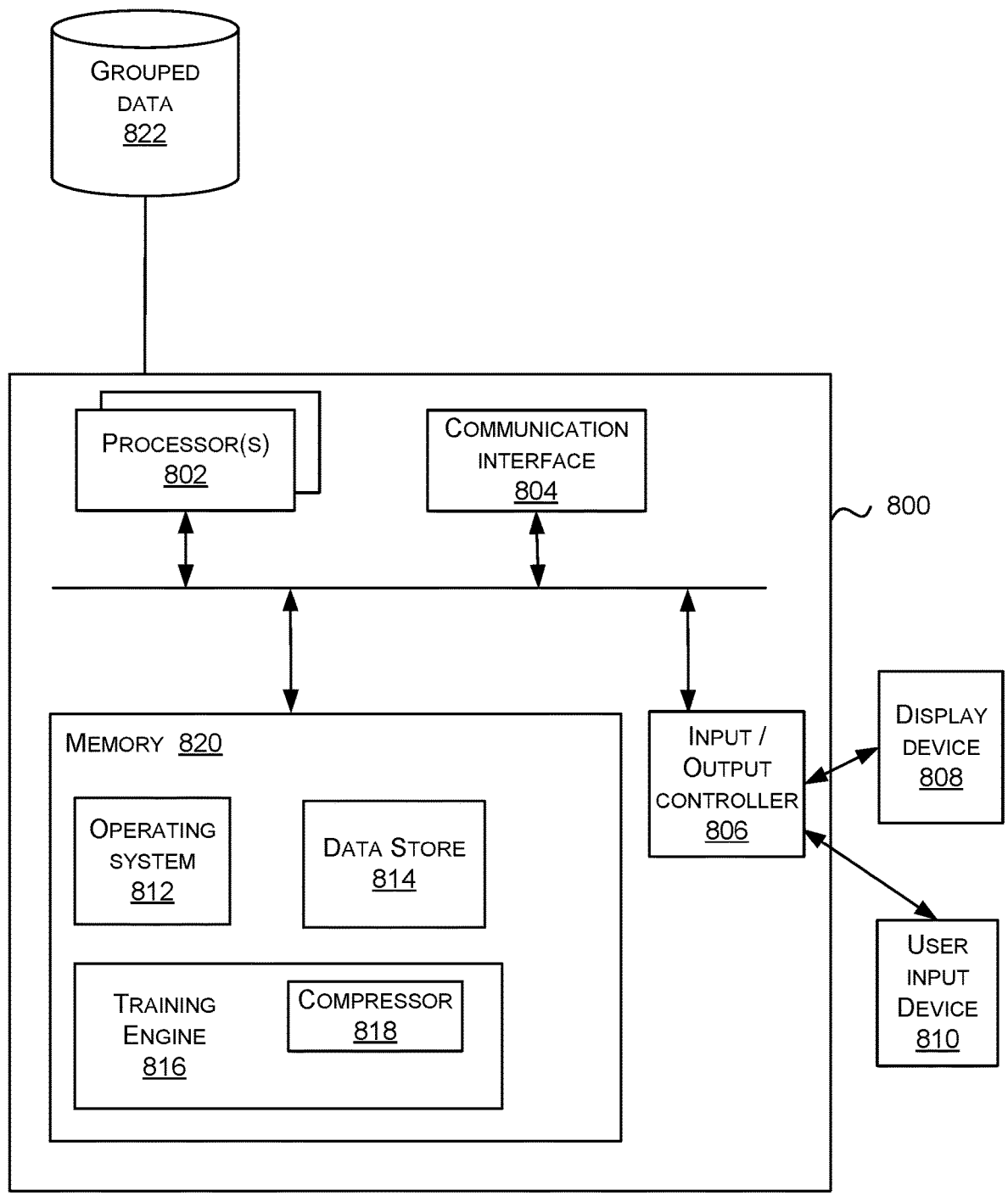
FIG. 8 illustrates an exemplary computing-based device in which embodiments of a compressor, or a training engine comprising a compressor are implemented.

FIG. 8 illustrates various components of an exemplary computing-based device 800 which are implemented as any form of a computing and/or electronic device, and in which embodiments of a training engine for training a compressor, or of a trained compressor are implemented in some examples.

Computing-based device 800 comprises one or more processors 802 which are microprocessors, controllers or any other suitable type of processors for processing computer executable instructions to control the operation of the device in order to train a compressor and/or to use a trained compressor at test time. In some examples, for example where a system on a chip architecture is used, the processors 802 include one or more fixed function blocks (also referred to as accelerators) which implement a part of the method of FIGS. 4 and 7 in hardware (rather than software or firmware). Platform software comprising an operating system 812 or any other suitable platform software is provided at the computing-based device to enable application software to be executed on the device. The application software is software for authoring, editing or manipulating content such as documents, videos, text messages, images, speech signals and others. Where the computing-based device 800 implements a training engine, the memory 820 comprises instructions for implementing training engine 816 and compressor 818. Where the computing-based device 800 comprises a compressor 818 but not a training engine 816 the training engine 816 is omitted. The computing-based device 800 is optionally in communication with a store of grouped data 822 such as via communication interface 804.

The computer executable instructions are provided using any computer-readable media that is accessible by computing based device 800. Computer-readable media includes, for example, computer storage media such as memory 820 and communications media. Computer storage media, such as memory 820, includes volatile and non-volatile, removable and non-removable media implemented in any method or technology for storage of information such as computer readable instructions, data structures, program modules or the like. Computer storage media includes, but is not limited to, random access memory (RAM), read only memory (ROM), erasable programmable read only memory (EPROM), electronic erasable programmable read only memory (EEPROM), flash memory or other memory technology, compact disc read only memory (CD-ROM), digital versatile disks (DVD) or other optical storage, magnetic cassettes, magnetic tape, magnetic disk storage or other magnetic storage devices, or any other non-transmission medium that is used to store information for access by a computing device. In contrast, communication media embody computer readable instructions, data structures, program modules, or the like in a modulated data signal, such as a carrier wave, or other transport mechanism. As defined herein, computer storage media does not include communication media. Therefore, a computer storage medium should not be interpreted to be a propagating signal per se. Although the computer storage media (memory 820) is shown within the computing-based device 800 it will be appreciated that the storage is, in some examples, distributed or located remotely and accessed via a network or other communication link (e.g. using communication interface 804). Memory 820 at the computing-based device comprises a data store 814 which holds training data, group data, encoder parameter values, decoder parameter values, objective functions, grouping operation instructions, criteria, rules, input instances, output instances, encodings, revised encodings or other data.

The computing-based device 800 also comprises an input/output controller 806 arranged to output display information to a display device 808 which may be separate from or integral to the computing-based device 800. The display information may provide a graphical user interface. The input/output controller 806 is also arranged to receive and process input from one or more devices, such as a user input device 810 (e.g. a touch panel sensor, stylus, mouse, keyboard, camera, microphone or other sensor). In some examples the user input device 810 detects voice input, user gestures or other user actions and provides a natural user interface (NUI). This user input may be used to specify when and/or how to manipulate encodings from the encoder, specify sources of training data, to provide group information and for other purposes. In an embodiment the display device 808 also acts as the user input device 810 if it is a touch sensitive display device. The input/output controller 806 outputs data to devices other than the display device in some examples, e.g. a locally connected printing device.

Any of the input/output controller 806, display device 808 and the user input device 810 may comprise natural user interface (NUI) technology which enables a user to interact with the computing-based device in a natural manner, free from artificial constraints imposed by input devices such as mice, keyboards, remote controls and the like. Examples of NUI technology that are provided in some examples include but are not limited to those relying on voice and/or speech recognition, touch and/or stylus recognition (touch sensitive displays), gesture recognition both on screen and adjacent to the screen, air gestures, head and eye tracking, voice and speech, vision, touch, gestures, and machine intelligence. Other examples of NUI technology that are used in some examples include intention and goal understanding systems, motion gesture detection systems using depth cameras (such as stereoscopic camera systems, infrared camera systems, red green blue (rgb) camera systems and combinations of these), motion gesture detection using accelerometers/gyroscopes, facial recognition, three dimensional (3D) displays, head, eye and gaze tracking, immersive augmented reality and virtual reality systems and technologies for sensing brain activity using electric field sensing electrodes (electro encephalogram (EEG) and related methods).

A computer-implemented data compression apparatus comprising:
an encoder configured to receive an input data item and to compress the data item into an encoding comprising a plurality of numerical values, where the numerical values are grouped at least according to whether they relate to content of the input data item or style of the input data item;
a memory configured to store the encoding; and
wherein the encoder has been trained using:
a plurality of groups of training data items grouped according to the content and where training data items within individual ones of the groups vary with respect to the style, and
a training objective which takes into account the groups.

The data compression apparatus described above wherein the encoder comprises a neural network with an output layer separated into at least two parts, one of which outputs numerical values of the encoding related to the content and one of which outputs numerical values of the encoding related to the style.

The data compression apparatus described above comprising a decoder configured to decode an encoding of the encoder to compute an output data item which is substantially the same as the input data item.

The data compression apparatus described above wherein the encoder and the decoder have been trained together using the plurality of groups of training data and the training objective.

The data compression apparatus described above comprising a grouper configured to compute a revised encoding from the encoding using at least a second encoding of a second data item computed by the encoder.

The data compression apparatus described above comprising a manipulator configured to alter the numerical values of the encoding to produce a manipulated encoding.

The data compression apparatus described above comprising a decoder configured to decode the manipulated encoding to compute a new data item.

The data compression apparatus described above wherein the manipulator is configured to alter the numerical values of the encoding by one or more of: swapping values between two or more encodings, transferring values from one encoding to another, interpolating values from one encoding to another, scaling values of an encoding, transforming values of an encoding according to user input made in relation to a graphical representation of a multi-dimensional space of latent variables.

The data compression apparatus described above wherein the encoder is configured to compute parameters of normal probability density functions.

A computer-implemented data decompression apparatus comprising:
 a decoder configured to receive an encoding of a data item, the encoding comprising a plurality of numerical values, where the numerical values are separated at least according to whether they relate to content of the data item or style of the data item, and to decode the encoding into an output data item which is substantially the same as the data item; and
  wherein the decoder has been trained using:
   a plurality of groups of training data items grouped according to the content and where training data items within individual ones of the groups vary with respect to the style, and
   a training objective which takes into account the groups.

A computer-implemented method comprising:
 training, using a processor, an encoder to receive an input data item and to compress the data item into an encoding comprising a plurality of numerical values, where the numerical values are grouped at least according to whether they relate to content of the input data item or style of the input data item;
 storing the encoding; and
 wherein the training comprises using:
  a plurality of groups of training data items grouped according to the content and where training data items within individual ones of the groups vary with respect to the style, and
  a training objective which takes into account the groups.

The method described above wherein the training objective is an average group evidence lower bound.

The method described above wherein the evidence lower bound of a group is equal to the sum over a plurality of instances in the group, of the expectation from a posterior distribution over content latent variables, of the expectation from a posterior distribution over a style latent variable, of the logarithm of the probability of a sample instance from the group given a content latent variable of the group and a style latent variable of the instance and parameters of a decoder, minus at least one regularizer term.

The method described above wherein the training comprises using the encoder to compute encodings of training data items of a group, and computing a grouping operation on the encodings.

The method described above wherein the grouping operation comprises applying a bias term to the encodings of the training data items.

The method described above wherein the grouping operation comprises computing a product of density functions corresponding to the encodings.

The method described above wherein the grouping operation comprises computing a mixture of density functions corresponding to the encodings.

The method described above comprising, after the grouping operation, decoding the encodings using a decoder and updating parameters of the encoder and the decoder according to the training objective.

The method described above comprising training a first neural network as the encoder and training a second neural network as a decoder such that the decoder decodes the encoding to produce an output data item which is substantially the same as the input data item.

The method described above comprising training a decoder to decode the encoding by using the training data and the training objective and wherein the training objective is an average group evidence lower bound, where a group evidence lower bound is a lower bound on a marginal likelihood of observations within one group arising from the decoder.

A computer-implemented image compression apparatus comprising:
 an encoder configured to receive an input image and to compress the image into an encoding comprising a plurality of numerical values, where the numerical values are grouped at least according to whether they relate to content of the image or style of the image;
 a memory configured to store the encoding; and
 wherein the encoder has been trained using:
  a plurality of groups of training images grouped according to the content and where training images within individual ones of the groups vary with respect to the style, and
  a training objective which takes into account the groups The term 'computer' or 'computing-based device' is used herein to refer to any device with processing capability such that it executes instructions. Those skilled in the art will realize that such processing capabilities are incorporated into many different devices and therefore the terms 'computer' and 'computing-based device' each include personal computers (PCs), servers, mobile telephones (including smart phones), tablet computers, set-top boxes, media players, games consoles, personal digital assistants, wearable computers, and many other devices.

The methods described herein are performed, in some examples, by software in machine readable form on a tangible storage medium e.g. in the form of a computer program comprising computer program code means adapted to perform all the operations of one or more of the methods described herein when the program is run on a computer and where the computer program may be embodied on a computer readable medium. The software is suitable for execution on a parallel processor or a serial processor such that the method operations may be carried out in any suitable order, or simultaneously.

This acknowledges that software is a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions are optionally distributed across a network. For example, a remote computer is able to store an example of the process described as software. A local or terminal computer is able to access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a digital signal processor (DSP), programmable logic array, or the like.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The operations of the methods described herein may be carried out in any suitable order, or simultaneously where appropriate. Additionally, individual blocks may be deleted from any of the methods without departing from the scope of the subject matter described herein. Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

The term 'subset' is used herein to refer to a proper subset such that a subset of a set does not comprise all the elements of the set (i.e. at least one of the elements of the set is missing from the subset).

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the scope of this specification.

The invention claimed is:

1. A computer-implemented data compression apparatus comprising:
   a processor configured to act as an encoder, wherein the encoder is configured to receive an input data item and to compress the input data item into an encoding comprising a plurality of numerical values, where the numerical values are grouped at least according to whether they relate to a first factor of variation of the input data item or a second factor of variation of the input data item;
   a memory configured to store the encoding;
   wherein the encoder has been trained using:
      a plurality of groups of training data items grouped according to the first factor of variation of the input data item and where training data items within individual ones of the groups vary with respect to the second factor of variation of the input data item, and
      a training objective which takes into account the groups.

2. The data compression apparatus of claim 1 wherein the encoder comprises a neural network with an output layer separated into at least two parts, one of which outputs numerical values of the encoding related to the first factor of variation of the input data item and one of which outputs numerical values of the encoding related to the second factor of variation of the input data item.

3. The data compression apparatus of claim 1 comprising a decoder configured to decode an encoding of the encoder to compute an output data item which is substantially the same as the input data item.

4. The data compression apparatus of claim 3 wherein the encoder and the decoder have been trained together using the plurality of groups of training data and the training objective.

5. The data compression apparatus of claim 1 comprising a grouper configured to compute a revised encoding from the encoding using at least a second encoding of a second data item computed by the encoder.

6. The data compression apparatus of claim 1, wherein the second factor of variation is replaceable for manipulation of the input data item.

7. The data compression apparatus of claim 6 comprising a decoder configured to decode the manipulated encoding to compute a new data item.

8. The data compression apparatus of claim 6 wherein the manipulator is configured to alter the numerical values of the encoding by one or more of: swapping values between two or more encodings, transferring values from one encoding to another, interpolating values from one encoding to another, scaling values of an encoding, transforming values of an encoding according to user input made in relation to a graphical representation of a multi-dimensional space of latent variables.

9. The data compression apparatus of claim 1 wherein the encoder is configured to compute parameters of normal probability density functions.

10. A computer-implemented data decompression apparatus comprising:
   a processor configured to act as a decoder, wherein the decoder is configured to receive an encoding of a data item, the encoding comprising a plurality of numerical values, where the numerical values are separated at least according to whether they relate to a first factor of variation of the data item or a second factor of variation of the data item, and to decode the encoding into an output data item which is substantially the same as the data item; and wherein the decoder has been trained using:
- a plurality of groups of training data items grouped according to the first factor of variation of the data item and where training data items within individual ones of the groups vary with respect to the second factor of variation of the data item, and
- a training objective which takes into account the groups.

11. A computer-implemented method comprising:

training, using a processor, an encoder to receive an input data item and to compress the data item into an encoding comprising a plurality of numerical values, where the numerical values are grouped at least according to whether they relate to a first factor of variation of the input data item or a second factor of variation of the input data item;

storing the encoding; and wherein the training comprises using:
- a plurality of groups of training data items grouped according to the first factor of variation of the input data item and where training data items within individual ones of the groups vary with respect to the second factor of variation of the input data item, and
- a training objective which takes into account the groups.

12. The method of claim 11 wherein the training objective is an average group evidence lower bound.

13. The method of claim 12 wherein the evidence lower bound of a group is equal to the sum over a plurality of instances in the group, of the expectation from a posterior distribution over content latent variables, of the expectation from a posterior distribution over a style latent variable, of the logarithm of the probability of a sample instance from the group given a content latent variable of the group and a style latent variable of the instance and parameters of a decoder, minus at least one regularizer term.

14. The method of claim 11 wherein the training comprises using the encoder to compute encodings of training data items of a group, and computing a grouping operation on the encodings.

15. The method of claim 14 wherein the grouping operation comprises applying a bias term to the encodings of the training data items.

16. The method of claim 14 wherein the grouping operation comprises computing a product of density functions corresponding to the encodings.

17. The method of claim 14 wherein the grouping operation comprises computing a mixture of density functions corresponding to the encodings.

18. The method of claim 14 comprising, after the grouping operation, decoding the encodings using a decoder and updating parameters of the encoder and the decoder according to the training objective.

19. The method of claim 11 comprising training a first neural network as the encoder and training a second neural network as a decoder such that the decoder decodes the encoding to produce an output data item which is substantially the same as the input data item.

20. The method of claim 11 comprising training a decoder to decode the encoding by using the training data and the training objective and wherein the training objective is an average group evidence lower bound, where a group evidence lower bound is a lower bound on a marginal likelihood of observations within one group arising from the decoder.

* * * * *